(12) United States Patent  (10) Patent No.: US 7,573,091 B2
Higashi  (45) Date of Patent: Aug. 11, 2009

(54) SEMICONDUCTOR DEVICE AND METHOD OF MANUFACTURING THE SAME

(75) Inventor: Masahiko Higashi, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 457 days.

(21) Appl. No.: 11/362,317

(22) Filed: Feb. 23, 2006

(65) Prior Publication Data
US 2006/0240620 A1 Oct. 26, 2006

Related U.S. Application Data

(63) Continuation of application No. PCT/JP2005/002890, filed on Feb. 23, 2005.

(51) Int. Cl.
*H01L 21/331* (2006.01)
(52) U.S. Cl. .................. 257/316; 257/321; 257/324
(58) Field of Classification Search ........... 257/316, 257/314, 324, 315, 330, 332
See application file for complete search history.

(56) References Cited

U.S. PATENT DOCUMENTS

| 5,583,064 A | 12/1996 | Lee et al. |
| 6,011,725 A | 1/2000 | Eitan |
| 7,091,550 B2 * | 8/2006 | Hsu et al. .................. 257/317 |
| 2004/0082198 A1 | 4/2004 | Nakamura et al. |
| 2004/0110390 A1 | 6/2004 | Takagi et al. |

FOREIGN PATENT DOCUMENTS

| JP | 07-226513 | 8/1995 |
| JP | 2004-012573 | 1/2004 |
| JP | 2004-111737 | 4/2004 |
| JP | 2004-193178 | 7/2004 |

* cited by examiner

*Primary Examiner*—Michael Trinh

(57) ABSTRACT

The present invention relates to a semiconductor device that includes a semiconductor substrate (10) having source/drain diffusion regions (14) formed therein and control gates (20) formed thereon, with grooves (18) being formed on the surface of the semiconductor substrate (10) and being located below the control gates (20) and between the source/drain diffusion regions (14). The grooves (18) are separated from the source/drain diffusion regions (14), thereby increasing the effective channel length to maintain a constant channel length for charge accumulation while enabling the manufacture of smaller memory cells. The present invention also provides a method of manufacturing the semiconductor device.

4 Claims, 6 Drawing Sheets

SEMICONDUCTOR DEVICE AND METHOD OF MANUFACTURING THE SAME

CROSS-REFERENCES TO RELATED APPLICATIONS

This is a continuation of International Application No. PCT/JP2005/002890, filed Feb. 23, 2005 which was not published in English under PCT Article 21(2).

BACKGROUND OF THE INVENTION

1. Field of the Invention

The present invention generally relates to a non-volatile memory and a method of manufacturing the non-volatile memory, and more particularly, to a non-volatile memory having an ONO (Oxide Nitride Oxide) film and a method of manufacturing such non-volatile memory.

2. Description of the Related Art

In recent years, data-rewritable semiconductor devices, such as non-volatile memories, have been generally used. In the field of non-volatile memory technology, development effort is being focused to produce smaller memory cells for use in high-capacity memories.

Among non-volatile memories, floating gate flash memories that accumulate charges in the floating gates have been widely used. However, with smaller memory cells being employed to achieve a higher memory capacity, it is difficult to design such floating gate flash memory devices. As the memory cells in a floating gate flash memory become smaller, the tunnel oxide film must necessarily become thinner. With a thinner tunnel oxide film, the leakage current flowing through the tunnel oxide film increases, causing defects in the tunnel oxide film. As a result, the charges accumulated in the floating gate are lost and the reliability of the flash memory device is decreased.

To counter this problem, flash memories having ONO films of such types as MONOS (Metal Oxide Nitride Oxide Silicon) type and SONOS (Silicon Oxide Nitride Oxide Silicon) type have been developed. In such flash memories, charges are accumulated in a silicon nitride film called a trap layer that is interposed between silicon oxide films, the silicon nitride film being an insulating film. Accordingly, even if there are defects in the tunnel oxide film, charge loss is not caused as easily as in a conventional floating gate flash memory. Furthermore, it is possible to store multi-value bits in the trap layer of a single memory cell, which is advantageous for manufacturing a high-capacity non-volatile memory. Such a flash memory of the prior art having such an ONO film is disclosed in U.S. Pat. No. 6,011,725, for example.

Figure 1:
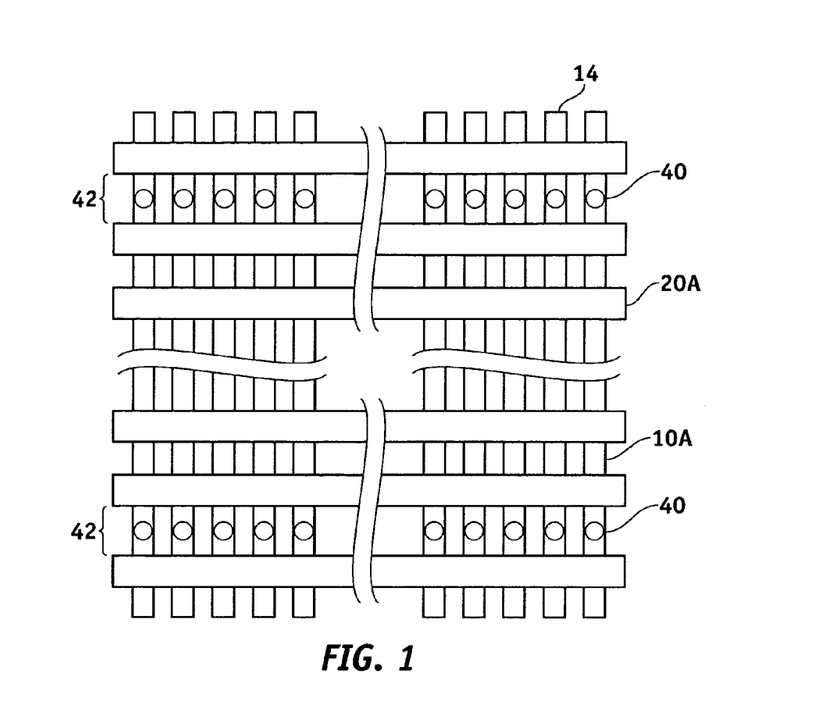
FIG. 1 is a top view of a conventional memory cell region.
Figure 2:
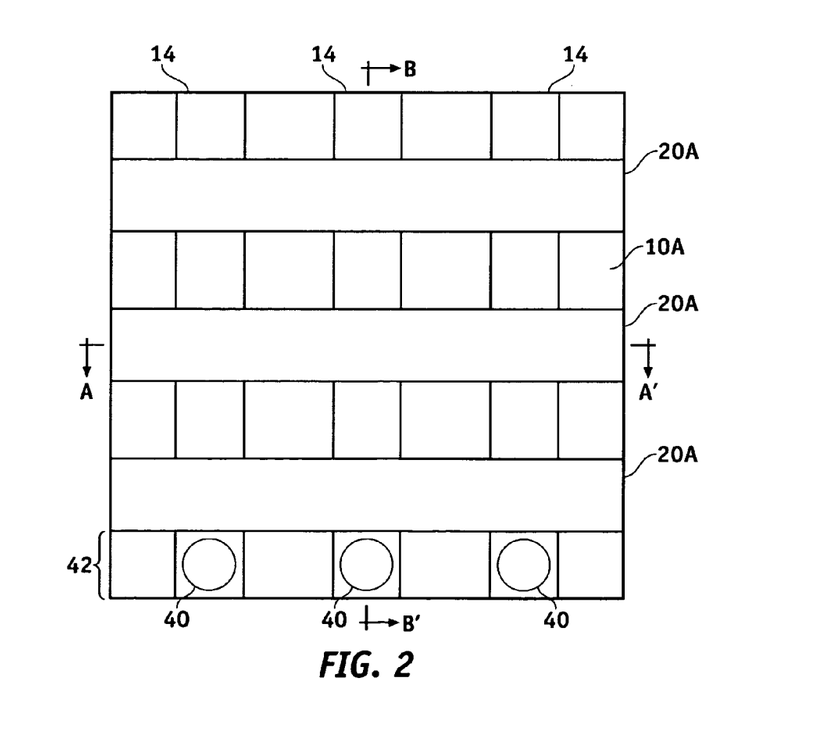
FIG. 2 is an enlarged top view of the conventional memory cell region.
Figure 3A:
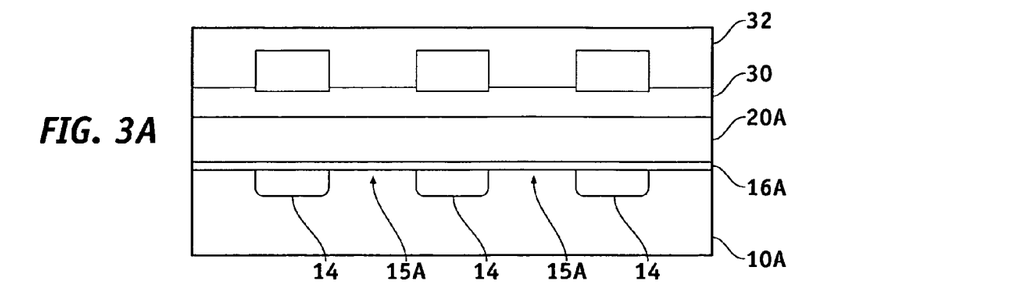
FIG. 3A is a cross-sectional view of the memory cell region, taken along the line A-A' of FIG. 2.
Figure 3B:
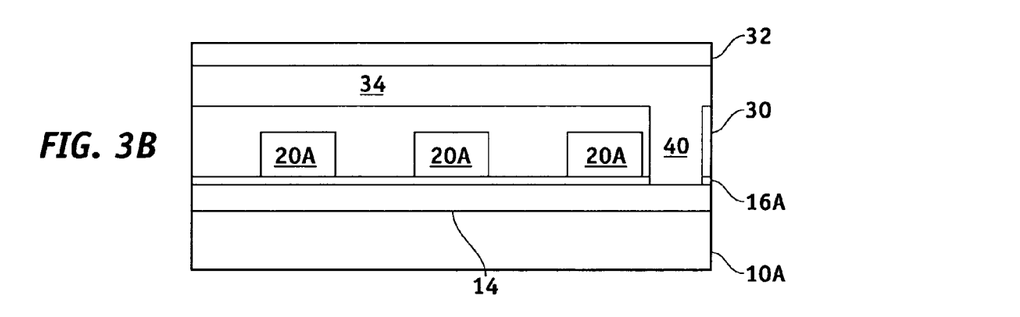
FIG. 3B is a cross-sectional view of the memory cell region, taken along the line B-B' of FIG. 2.

The conventional flash memory having an ONO film (hereinafter referred to as the "prior art") is now described. FIG. 1 is a top view of a memory cell region of the prior art (excluding a protection film 32, a line 34, an interlayer insulating film 30, and an ONO film 16a). FIG. 2 is an enlarged view of a part of FIG. 1. FIG. 3A is a cross-sectional view of the memory cell region, taken along the line A-A' of FIG. 2. FIG. 3B is a cross-sectional view of the memory cell region, taken along the line B-B' of FIG. 2.

As shown in FIGS. 1 and 2, the memory cell region includes source/drain diffusion regions 14 that are formed in a semiconductor substrate 10a and also serve as bit lines extending in the vertical direction, and control gates 20a that are formed on the semiconductor substrate 10a and also serve as word lines extending in the transverse direction. As shown in FIGS. 3A and 3B, the source/drain diffusion regions 14 are diffused regions that are formed through impurity ion implantation to the p-type silicon semiconductor substrate 10a followed by thermal treatment performed on the semiconductor substrate 10a. The source/drain diffusion regions 14 are embedded in the semiconductor substrate 10a. The ONO film 16a is formed on the semiconductor substrate 10a, and the control gates 20a are formed on the ONO film 16a. The portions of the semiconductor substrate 10a that are located below the control gates 20a and are interposed between the source/drain diffusion regions 14 are channels 15a.

A silicon oxide film such as BoroPhospho Silicated Glass (BPSG) is formed as the interlayer insulating film 30 on the transistors. The line 34 is formed on the interlayer insulating film 30 and is in contact with the source/drain diffusion regions 14 via a contact hole 40. The protection film 32 is formed on the line 34.

The ONO film 16a includes a silicon oxide layer that is a tunnel oxide film, a silicon nitride layer that is a trap layer, and a silicon oxide layer that is a top oxide film. Data writing is performed by inducing a high electric field in the channels 15a, injecting hot electrons to the trap layer on the channels 15a, and accumulating the hot electrons in the trap layer. Since the trap layer is interposed between the silicon oxide films, the charges accumulated in the trap layer are retained. Data erasing may be performed by injecting hot holes generated from the channels 15a to the trap layer or by applying a Fowler-Nordheim (F-N) tunnel current to the tunnel oxide film.

Also, as shown in FIG. 15 of U.S. Pat. No. 6,011,725, charges can be accumulated at two locations in one transistor and, accordingly, two-value data can be stored in one memory cell. Thus, a higher memory capacity can be achieved.

Since the source/drain diffusion regions 14 serve also as bit lines, the memory cells can be miniaturized. However, being formed with diffused regions, the source/drain diffusion regions 14 have a higher resistance than metal. As a result, with the source/drain diffusion regions 14 serving also as bit lines, the data writing and reading characteristics deteriorate. To counter this problem, a bit-line/contact region 42 is provided for each predetermined number of word lines (control gates) 20a, as shown in FIG. 1. In the bit-line/contact regions 42, the source/drain diffusion regions 14 serving also as bit lines are connected to the metal line 34 via the contact hole 40. In this manner, the resistance of the bit lines is lowered to improve the data writing and reading characteristics.

In the prior art, however, it is difficult to make the memory cells smaller. This problem is described in greater detail hereinbelow. In the prior art, the source/drain diffusion regions 14 are formed with diffused regions. Functioning also as bit lines, the source/drain diffusion regions 14 need to extend below the control gates 20a which also function as word lines. Therefore, the source/drain diffusion regions 14 are formed prior to the formation of the control gates 20a. After the formation of the source/drain diffusion regions 14, thermal treatment is carried out during the procedures for forming the control gates 20a and the line 34. Through the thermal treatment, impurities in the source/drain diffusion regions 14 are dispersed in the transverse direction, and each source/drain diffusion region 14 thereby becomes wider. As a result, the channel length becomes smaller. With a smaller channel length, a sufficient area for accumulating charges cannot be secured in the ONO film 16a. To avoid the inconvenience, the distance between each two adjacent source/drain diffusion regions 14 is lengthened, so as to secure a sufficient channel length. In doing so, however, miniaturization of the memory cells becomes difficult.

Meanwhile, when the source/drain diffusion regions 14 are formed, the dose amount and the ion energy for ion implantation are reduced, so as to restrict the impurity dispersion in the transverse direction and increase the channel length. However, the bit line resistance becomes higher, as the source/drain diffusion regions 14 function also as the bit lines. So as not to degrade the data writing and reading characteristics, connecting to the line 34 via the contact hole 40 needs to be performed frequently. To do so, however, a large number of bit-line/contact regions 42 are required, and miniaturization of the memory cells becomes even more difficult.

SUMMARY OF THE INVENTION

It is therefore an object of the present invention to provide a semiconductor device that can secure a constant channel length that is large enough to accumulate charges even if the source/drain diffusion regions become wider in the transverse direction. In such a semiconductor device, smaller memory cells can be used. It is also an object of the present invention to provide a method of manufacturing such a semiconductor device.

According to an aspect of the present invention, there is provided a semiconductor device that includes a semiconductor substrate that has source/drain diffusion regions, an ONO film that is formed on the semiconductor substrate, and control gates that are provided on the ONO film, with the semiconductor substrate having grooves formed below the control gate and located between the source/drain diffusion regions. The grooves are formed in each channel so as to increase the effective channel length and are separated from the source/drain diffusion regions. With this structure, a constant channel length large enough to accumulate charges can be secured, even if the source/drain diffusion regions become wider in the transverse direction. In this semiconductor device, smaller memory cells can be employed.

In a semiconductor device in accordance with the present invention, each of the source/drain diffusion regions may be self-aligned with adjacent grooves. With this structure, separation of the grooves from the source/drain diffusion regions can be assured and data writing can be easily performed.

In the semiconductor device in accordance with the present invention, the source/drain diffusion regions may also serve as bit lines. With this structure, the memory cells can be made smaller. In addition, the ONO film may be in contact with a surface of each of the grooves. With this structure, a constant channel length that is large enough to accumulate charges can be secured in the ONO film.

According to another aspect of the present invention, there is provided a method of manufacturing a semiconductor device, including the steps of forming grooves on a semiconductor substrate, forming source/drain diffusion regions between which the grooves are located, forming an ONO film on the semiconductor substrate, and forming control gates on the ONO film. The grooves are formed in each channel so as to increase the effective channel length. With this structure, a constant channel length that is large enough to accumulate charges can be secured, even if the source/drain diffusion regions become wider in the transverse direction. In this semiconductor device, smaller memory cells can be employed.

In accordance with this method, the step of forming the grooves may include the steps of thermally oxidizing a surface of the semiconductor substrate to form a silicon oxide film and removing the silicon oxide film. The variation in groove depth can be made smaller and the variation in transistor characteristics can also be smaller in the semiconductor device.

This method may further include the steps of forming an insulating film having openings on the semiconductor substrate and forming a sidewall around each of the openings. In this method, the step of thermally oxidizing the surface of the semiconductor substrate involves utilizing the insulating film and the sidewalls as a mask. The grooves can be separated from the source/drain diffusion regions and data writing can be easily performed.

In accordance with this method, the step of forming the source/drain diffusion regions may include the step of implanting ions into the semiconductor substrate, with a mask being formed by the silicon oxide film and the sidewalls. Separation of the grooves from the source/drain diffusion regions can be assured and data writing can be easily performed.

Also, in accordance with this method, the insulating film may be formed with silicon nitride film and the sidewalls may be formed with silicon oxide film. When the insulating film is removed, the sidewalls and the thermal silicon oxide film can be selectively left.

The grooves may be formed in each channel to increase the effective channel length. With this structure, a constant channel length large enough to accumulate charges can be assured, even if the source/drain diffusion regions become wider in the transverse direction. In such semiconductor devices, smaller memory cells can be employed.

DETAILED DESCRIPTION OF AN EMBODIMENT OF THE INVENTION

Figure 4:
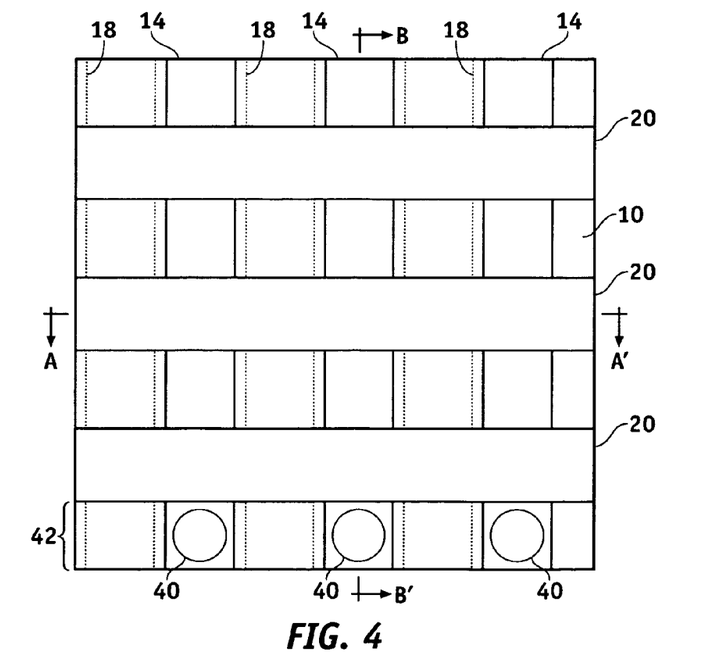
FIG. 4 is a top view of a memory cell region in accordance with an embodiment of the present invention.
Figure 5A:
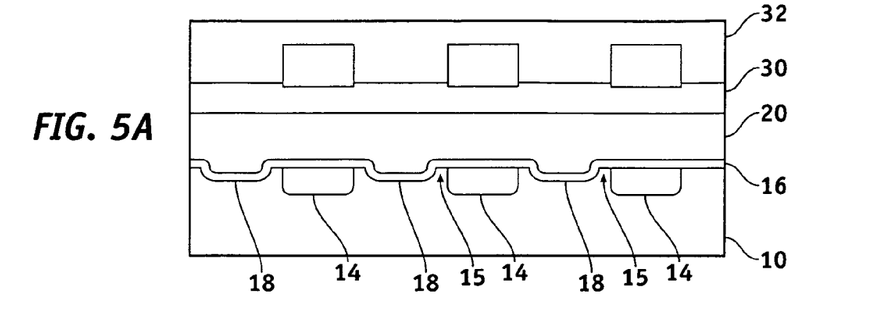
FIG. 5A is a cross-sectional view of the memory cell region in accordance with an embodiment of the present invention, taken along the line A-A' of FIG. 4.
Figure 5B:
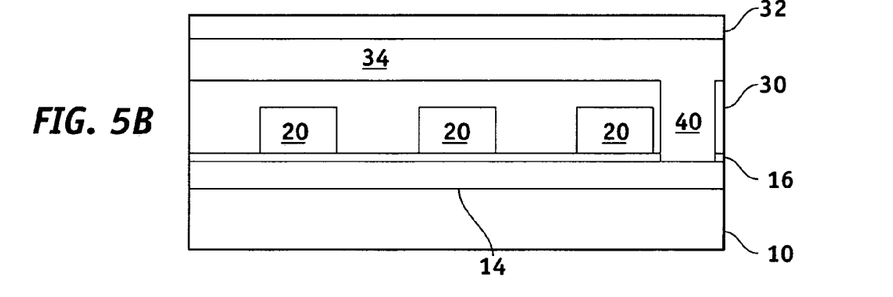
FIG. 5B is a cross-sectional view of the memory cell region in accordance with an embodiment of the present invention, taken along the line B-B' of FIG. 4.

The following is a description of an embodiment of the present invention. FIG. 4 is a top view of a memory cell region in accordance with an embodiment of the present invention (excluding a protection film 32, a line 34, an interlayer insulating film 30, and an ONO film 16). FIG. 5A is a cross-sectional view of the memory cell region, taken along the line A-A' of FIG. 4. FIG. 5B is a cross-sectional view of the memory cell region, taken along the line B-B' of FIG. 4. As shown in FIG. 4, the memory cell region has source/drain diffusion regions 14 serving also as bit lines extending in the vertical direction in a semiconductor substrate 10 and control gates 20 serving also as word lines extending in the transverse direction on the semiconductor substrate 10. In each channel region 15 formed between the source/drain diffusion regions 14, a groove 18 extending in the same direction as the extending direction of the source/drain diffusion regions 14 is formed (shown by broken lines in FIG. 4).

As shown in FIGS. 5A and 5B, the source/drain diffusion regions 14 are embedded in the p-type silicon semiconductor substrate 10. An ONO film 16 is formed on the semiconductor substrate 10 and the control gates are formed on the ONO film 16. The channels 15 are formed between the source/drain diffusion regions 14 and are located below the control gates 20. A groove 18 is formed in each channel 15. In other words, the grooves 18 are formed between the source/drain diffusion regions 14 on the surface of the semiconductor substrate 10 and are located below the control gates 20. An interlayer insulating film 30 is formed on the transistor and a line 34 is formed on the interlayer insulating film 30, is the line 34 connected to the source/drain diffusion regions 14 via a contact hole 40. A protection film 32 is then formed on the line 34.

In accordance with this embodiment, the effective channel length of each channel 15 is increased with the formation of the grooves 18. Also, the area of the ONO film 16 in which charges can be accumulated is increased. Accordingly, even if diffusion is caused in the transverse direction of the source/drain diffusion regions, a channel length large enough to accumulate charges can be constantly maintained, thereby permitting miniaturization of the memory cells. In fact, in a semiconductor device with this structure, memory cells can easily be made smaller.

Figure 6A:
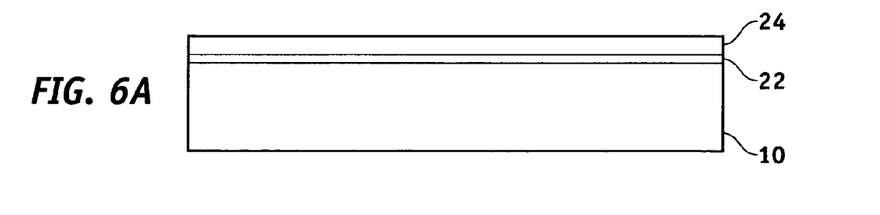
FIG. 6A is a cross-sectional view illustrating the first step in the process of manufacturing the memory cell region in accordance with an embodiment of the present invention, taken along the ling A-A' of FIG. 4.
Figure 6B:
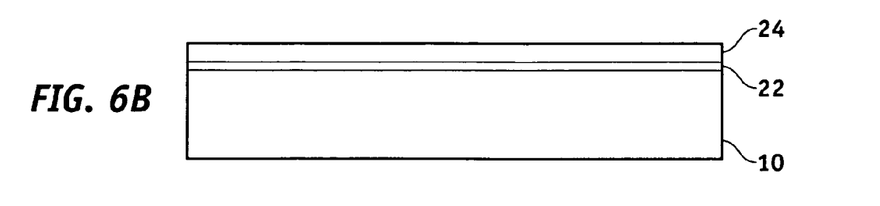
FIG. 6B is a cross-sectional view illustrating the first step in the process of manufacturing the memory cell region in accordance with an embodiment of the present invention, taken along the ling B-B' of FIG. 4.

Hereinafter, a manufacturing method in accordance with the embodiment of the present invention depicted in FIGS. 4, 5A and 5B is described. FIGS. 6A, 7A, 8A, 9A, 10A, 11A, and 12A are cross-sectional views of the memory cell region during processing taken along the line A-A' of FIG. 4. FIGS. 6B, 7B, 8B, 9B, 10B, 11B, and 12B are cross-sectional views of the memory cell region during processsing taken along the line B-B' of FIG. 4. Referring to FIGS. 6A and 6B, on the p-type silicon semiconductor substrate 10 (or in the p-type region in the semiconductor substrate 10), a silicon oxide film 22 is formed through thermal oxidization. Insulating films 24 are then formed on the silicon oxide film 22 by, for example, chemical vapor deposition (CVD). The insulating films 24 may be silicon nitride films with a thickness of 150 nm, for example.

Figure 7A:
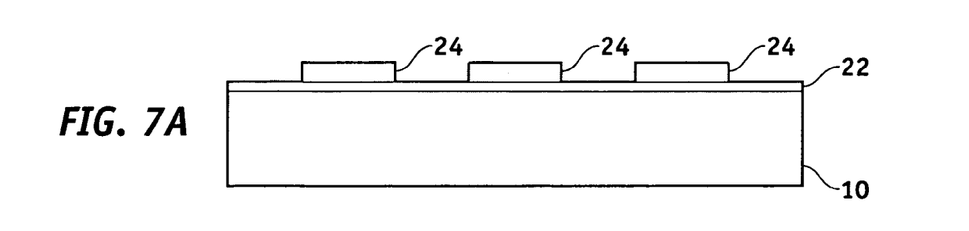
FIG. 7A is a cross-sectional view illustrating the second step in the process of manufacturing the memory cell region in accordance with an embodiment of the present invention, taken along the ling A-A' of FIG. 4.
Figure 7B:
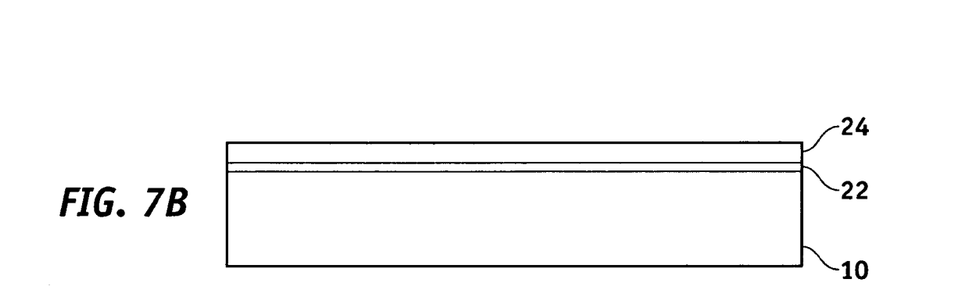
FIG. 7B is a cross-sectional view illustrating the second step in the process of manufacturing the memory cell region in accordance with an embodiment of the present invention, taken along the ling B-B' of FIG. 4.
Figure 8A:
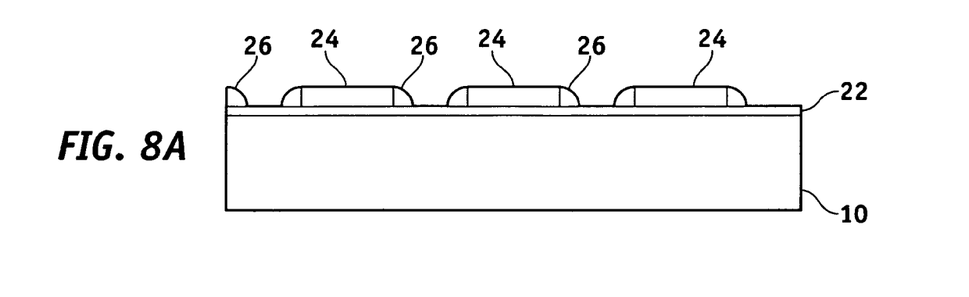
FIG. 8A is a cross-sectional view illustrating the third step in the process of manufacturing the memory cell region in accordance with an embodiment of the present invention, taken along the ling A-A' of FIG. 4.
Figure 8B:
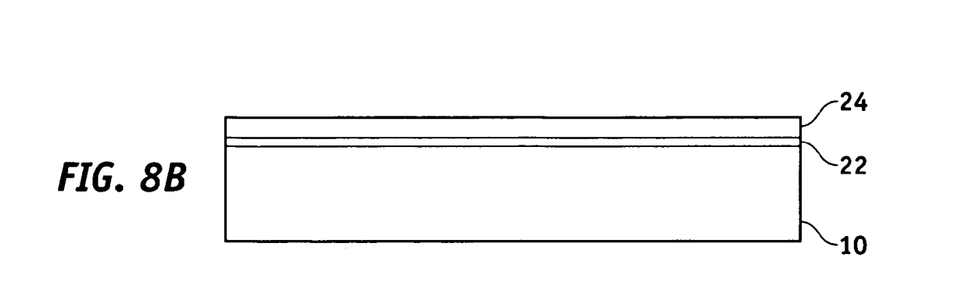
FIG. 8B is a cross-sectional view illustrating the third step in the process of manufacturing the memory cell region in accordance with an embodiment of the present invention, taken along the ling B-B' of FIG. 4.

In the procedure illustrated in FIGS. 7A and 7B, a predetermined region of each insulating film 24 is removed through regular exposure and dry etching, so as to form an opening. The width of the opening may be 200 nm, for example. In the procedure illustrated in FIGS. 8A and 8B, a silicon oxide film of 70 nm in thickness, for example, is formed, and anisotropic etching is performed on the entire surface of the silicon oxide film, so that a silicon oxide sidewall 26 of 50 nm in width, for example, is formed around the opening of each insulating film 24. The sidewall 26 can be adjusted to a desired width by varying the thickness of the silicon oxide film formed on the entire surface.

Figure 9A:
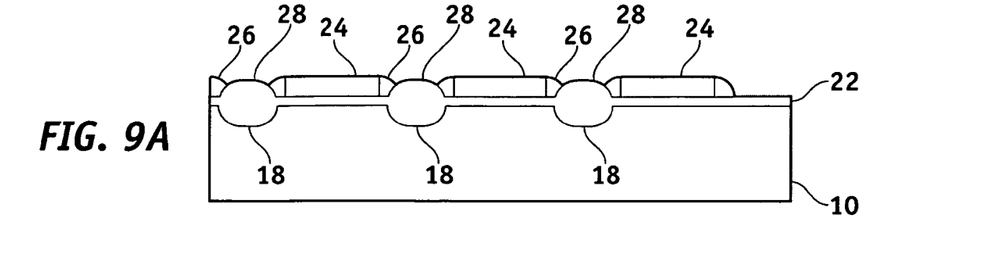
FIG. 9A is a cross-sectional view illustrating the fourth step in the process of manufacturing the memory cell region in accordance with an embodiment of the present invention, taken along the ling A-A' of FIG. 4.
Figure 9B:
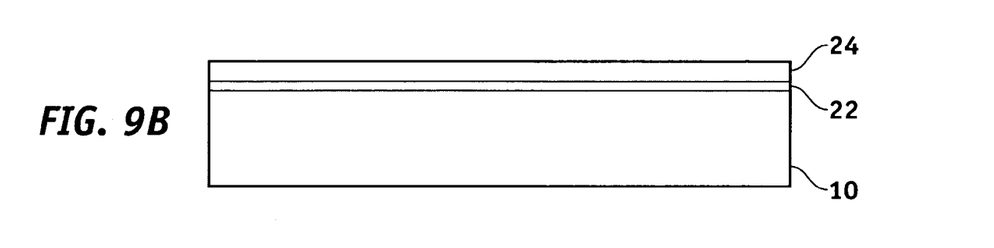
FIG. 9B is a cross-sectional view illustrating the fourth step in the process of manufacturing the memory cell region in accordance with an embodiment of the present invention, taken along the ling B-B' of FIG. 4.

As illustrated in FIGS. 9A and 9B, a silicon oxide film 28 is formed by thermally oxidizing the surface of the semiconductor substrate 10, with the insulating films 24 and the sidewalls 26 serving as a mask. The thickness of the silicon oxide film 28 is adjusted to 300 nm, for example, so that grooves 18 of approximately 140 nm are formed on the semiconductor substrate 10. The width of each groove 18 is substantially equal to the distance between each two adjacent sidewalls 26. For example, with the width of the opening of each insulating film 24 being 200 nm and the width of each sidewall 26 being 50 nm, the width of each groove 18 is approximately 100 nm.

Figure 10A:
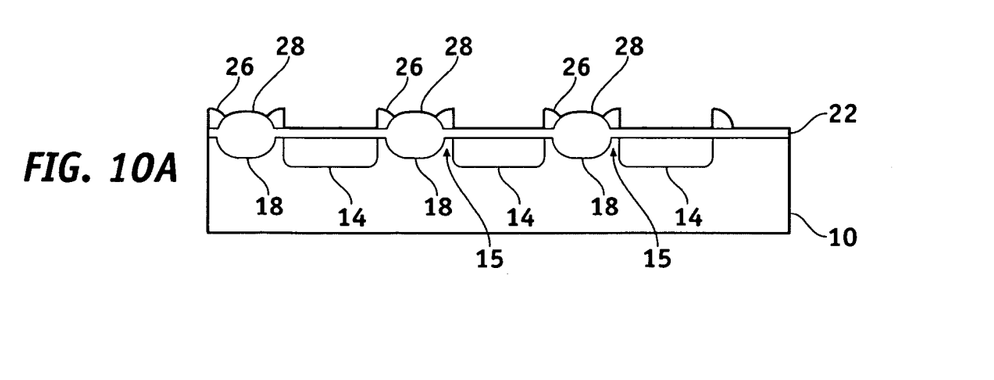
FIG. 10A is a cross-sectional view illustrating the fifth step in the process of manufacturing the memory cell region in accordance with an embodiment of the present invention, taken along the ling A-A' of FIG. 4.
Figure 10B:
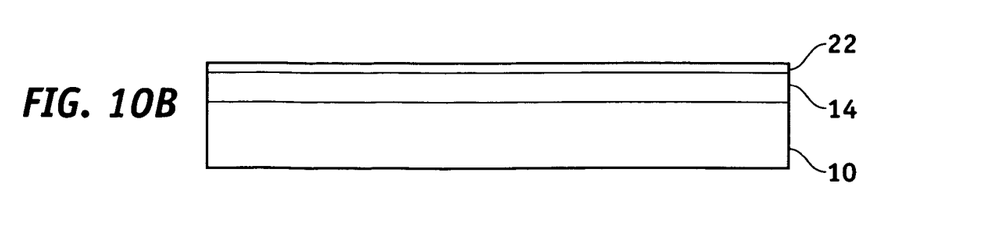
FIG. 10B is a cross-sectional view illustrating the fifth step in the process of manufacturing the memory cell region in accordance with an embodiment of the present invention, taken along the ling B-B' of FIG. 4.

Referring to FIGS. 10A and 10B, the nitride silicon film 24 is removed, using thermal phosphoric acid. Being formed with silicon oxide film, the sidewalls 26 are not removed with thermal phosphoric acid at this point. With the silicon oxide film 28 and the sidewalls 26 serving as a mask, arsenic ion implantation is performed, and thermal treatment is carried out to form the source/drain diffusion regions 14. The ion implantation is performed with an ion energy of 10 keV to 15 keV and a dose amount of $1\times10^{15}$ cm$^{-3}$. The portions of the semiconductor substrate 10 between the source/drain diffusion regions 14 become the channels 15.

Figure 11A:
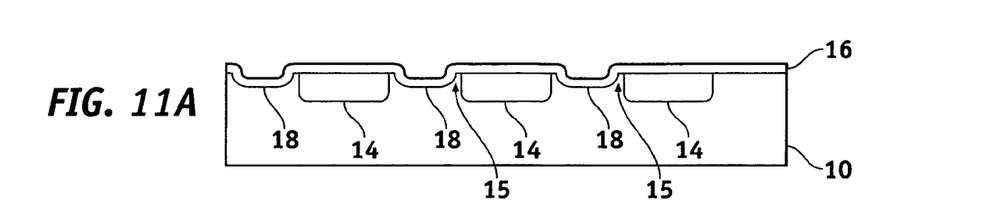
FIG. 11A is a cross-sectional view illustrating the sixth step in the process of manufacturing the memory cell region in accordance with an embodiment of the present invention, taken along the ling A-A' of FIG. 4.
Figure 11B:
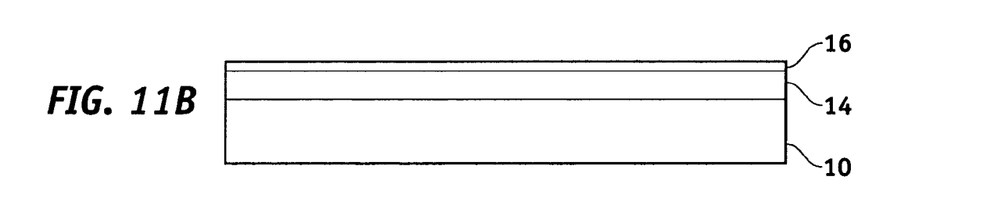
FIG. 11B is a cross-sectional view illustrating the sixth step in the process of manufacturing the memory cell region in accordance with an embodiment of the present invention, taken along the ling B-B' of FIG. 4.

In the procedure illustrated in FIGS. 11A and 11B, the oxide silicon film 28, the sidewalls 26, and the oxide silicon film 22 are removed with hydrofluoric acid. As a result, the grooves 18 are formed between the source/drain diffusion regions 14. Each groove 18 is at a distance equivalent to the width of each sidewall 26 from each adjacent source/drain diffusion region 14. So as to produce the ONO film 16, a silicon oxide film as a tunnel oxide film is formed through thermal oxidization or CVD, a silicon nitride film as a trap layer is formed through CVD, and a silicon oxide film as a top oxide film is formed through thermal oxidization or CVD. The tunnel oxide film, the trap layer, and the top oxide film are, for example, 7 nm, 10 nm, and 10 nm in thickness, respectively.

Figure 12A:
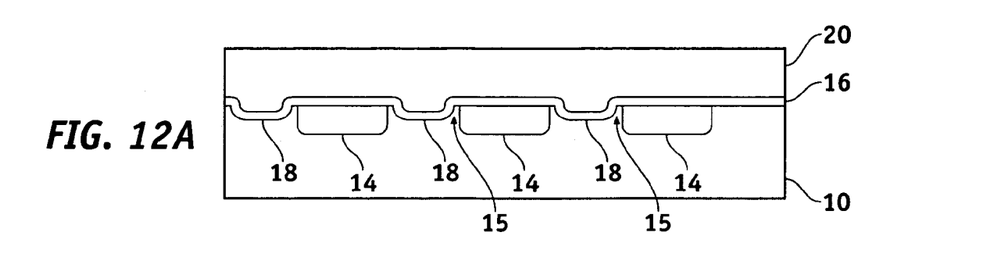
FIG. 12A is a cross-sectional view illustrating the seventh step in the process of manufacturing the memory cell region in accordance with an embodiment of the present invention, taken along the ling A-A' of FIG. 4.
Figure 12B:
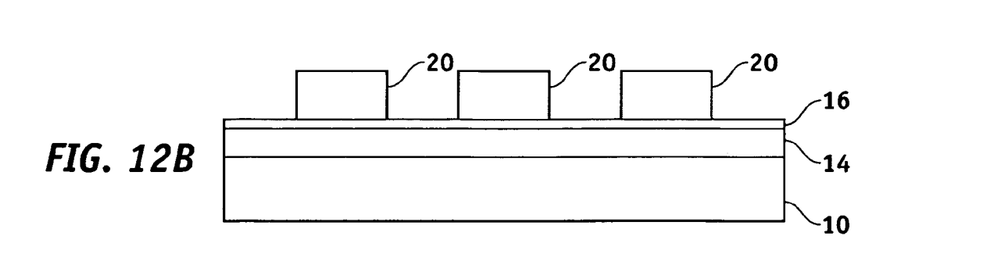
FIG. 12B is a cross-sectional view illustrating the seventh step in the process of manufacturing the memory cell region in accordance with an embodiment of the present invention, taken along the ling B-B' of FIG. 4.

Referring to FIGS. 12A and 12B, a polycrystalline silicon film, for example, is formed on the ONO film 16, and etching is performed on predetermined regions so as to form the control gates 20. Also, the polycrystalline silicon film is silicided to reduce the resistance of the control gates 20. The interlayer insulating film 30 is formed with a silicon oxide film such as BPSG, and the contact hole 40 is formed in the bit-line/contact region 42. The line 34 is made of aluminum, for example, and the protection film 32 is formed. While the memory cell region is produced in the above described manner, a flash memory can be manufactured by forming a peripheral circuit region on the same chip.

The grooves 18 may also be formed by etching, for example. If the grooves 18 are formed by etching, however, the grooves 18 vary in width, because of wafer in-plane variations in etching rate and reproducibility. As the grooves 18 vary in depth, the transistors vary in channel length, thereby exhibiting varied characteristics. As a result, the variation in transistor characteristics becomes wider.

In accordance with the above-described embodiment, the grooves 18 are formed by forming and removing the silicon oxide film 28. While the thickness of the silicon oxide film 28 may be affected by temperature, oxygen partial pressure, and time, it is easy to control temperature, oxygen partial pressure, and time. Accordingly, the film thickness of the silicon oxide film 28 can be adjusted so as to achieve a preferred wafer in-plane variation and excellent reproducibility when produced in accordance with the above-described embodiment of the present invention. Since the depth of each groove 18 is equivalent to the depth of the thermally oxidized portion of the silicon semiconductor substrate 10, the depth of each groove 18 can be adjusted to achieve a preferred wafer in-plane variation and excellent reproducibility. Thus, the wafer in-plane variation as the transistor characteristics can be improved, and excellent reproducibility can be achieved. Therefore, it is preferable to form the grooves 18 by forming the silicon oxide film 28 on the semiconductor substrate 10 and then removing the silicon oxide film 28 from the semiconductor substrate 10.

With the silicon oxide film 28 and the sidewalls 26 serving as a mask, ion implantation is performed to form the source/drain diffusion regions 14. By doing so, each groove 18 can be formed at a distance equivalent to the width of each sidewall 26 from each adjacent source/drain diffusion region 14. In this manner, the source/drain diffusion regions 14 are designed to be self-aligned with the grooves 18. If the grooves 18 come into contact with the source/drain diffusion regions 14, the profile of the impurity concentration from each channel 15 to each adjacent source/drain region 14 becomes smooth. This is because the profile of the impurity concentration after ion implantation is steeper in the direction perpendicular to the ion implanting direction than in the direction parallel to the ion implanting direction. When the profile of the impurity concentration from each channel 15 to each adjacent source/drain diffusion region 14 is not steep, the electric field at the end of each channel 15 on the side of each adjacent source/drain diffusion region 14 becomes smaller, hindering the generation of hot electrons at the time of data writing. As a result, data writing becomes difficult.

In accordance with the embodiment described above, the distance between each groove 18 and each adjacent source/drain diffusion region 14 can be maintained equal to the width of each sidewall 26, and the separation of the grooves 18 from the source/drain diffusion regions 14 is maintained. Accordingly, the profile of the impurity concentration from each channel 15 to each adjacent source/drain diffusion region 14 can be kept steep. In this manner, the electric field at the end of each channel 15 on the side of each adjacent source/drain diffusion region 14 becomes large facilitating the generation of hot electrons at the time of data writing. Thus, data writing can be made easier. Furthermore, the source/drain diffusion regions 14 are designed to be self-aligned with the grooves 18 so that the distance between each groove 18 and each adjacent source/drain diffusion region 14 can be adjusted with high precision. Thus, the variation in transistor characteristics, such as the above described data writing characteristics, can be made smaller.

Further in accordance with this embodiment, the insulating film 24 is formed with silicon nitride film and the sidewalls 26 are formed with silicon oxide film. Accordingly, after the formation of the silicon oxide film 28, the insulating film 24 can be readily and selectively removed with respect to the silicon oxide film 22, the sidewalls 26, and the silicon oxide film 28.

Although embodiments of the present invention have been described hereinabove, the present invention is not limited to these specific examples. Rather, various changes and modifications can be made to these embodiments without departing from the claimed scope of the present invention. For example, the present invention may be implemented in a MONOS (Metal Oxide Nitride Oxide Silicon) type or SONOS (Silicon Oxide Nitride Oxide Silicon) type flash memory. Also, the trap layer of the ONO film may be any other film, such as an aluminum oxide film, as long as it functions as a trap layer.

What is claimed is:

1. A semiconductor device comprising:
    a semiconductor substrate including source/drain diffusion regions formed therein to extend in a first direction, the semiconductor substrate further including channel regions defined between the source/drain regions and extending in the first direction;
    an ONO film formed on the semiconductor substrate over the channel regions and the source/drain regions; and
    a control gate provided on the ONO film and extending in a second direction perpendicular to the first direction, the control gate provided over portions of the channel regions and the source/drain regions,
    wherein the semiconductor substrate has a groove formed below the control gate and located in the channel regions between the source/drain diffusion regions, the groove being separated from the source/drain diffusion regions by a predetermined distance.

2. The semiconductor device as claimed in claim 1, wherein each of the source/drain diffusion regions is self aligned with the groove adjacent thereto.

3. The semiconductor device as claimed in claim 1, wherein the source/drain diffusion regions also serve as bit lines.

4. The semiconductor device as claimed in claim 1, wherein the ONO film is in contact with a surface of the groove.

* * * * *